(12) United States Patent
Nishimori et al.

(10) Patent No.: US 8,274,807 B2
(45) Date of Patent: Sep. 25, 2012

(54) POWER CONVERSION DEVICE

(75) Inventors: Hisao Nishimori, Okazaki (JP); Yasuharu Asai, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 226 days.

(21) Appl. No.: 12/527,041

(22) PCT Filed: Feb. 12, 2008

(86) PCT No.: PCT/JP2008/052607
§ 371 (c)(1),
(2), (4) Date: Jan. 15, 2010

(87) PCT Pub. No.: WO2008/099952
PCT Pub. Date: Aug. 21, 2008

(65) Prior Publication Data
US 2010/0117570 A1    May 13, 2010

(30) Foreign Application Priority Data
Feb. 13, 2007    (JP) .................................. 2007-032267

(51) Int. Cl.
*H02M 1/00*    (2007.01)
(52) U.S. Cl. ....................................... 363/147; 363/144
(58) Field of Classification Search .................. 363/132, 363/146, 147
See application file for complete search history.

(56) References Cited

U.S. PATENT DOCUMENTS

| | | | | |
|---|---|---|---|---|
| 6,259,616 B1 * | 7/2001 | Ekwall et al. | ................. | 363/132 |
| 6,462,976 B1 * | 10/2002 | Olejniczak et al. | ............ | 363/147 |
| 6,795,324 B2 * | 9/2004 | Mori et al. | ................... | 307/147 |
| 8,111,530 B2 * | 2/2012 | Ono et al. | ................. | 363/56.01 |
| 2006/0273592 A1 | 12/2006 | Yamabuchi et al. | | |

FOREIGN PATENT DOCUMENTS

| | | | |
|---|---|---|---|
| JP | 8 126349 | | 5/1996 |
| JP | 9 219970 | | 8/1997 |
| JP | 09219970 A | * | 8/1997 |
| JP | 2003 116281 | | 4/2003 |
| JP | 2004 335725 | | 11/2004 |
| JP | 2005 94882 | | 4/2005 |
| JP | 2005 192296 | | 7/2005 |
| JP | 2005 192328 | | 7/2005 |
| JP | 2005 287273 | | 10/2005 |
| JP | 2006 340569 | | 12/2006 |
| JP | 2007 209141 | | 8/2007 |

* cited by examiner

*Primary Examiner* — Jue Zhang
(74) *Attorney, Agent, or Firm* — Oblon, Spivak, McClelland, Maier & Neustadt, L.L.P.

(57) ABSTRACT

A boost power module and an inverter form a semiconductor module. A smoothing capacitor is arranged outside the semiconductor module. A bus bar forming a power supply line is divided into bus bars, between which a lead member extending outward from the semiconductor module is coupled. The lead member has an electric contact with one of terminals of the capacitor arranged outside the semiconductor module. A bus bar forming an earth line is divided into bus bars, between which a lead member extending outward from the semiconductor module is coupled. The lead member has an electric contact with the other terminal of capacitor.

9 Claims, 6 Drawing Sheets

POWER CONVERSION DEVICE

TECHNICAL FIELD

The present invention relates to a power conversion device, and particularly to a power conversion device having a plurality of electric conversion units.

BACKGROUND ART

In recent years, attention has been given to hybrid vehicles and electric vehicles against the background of environmental issues. The hybrid vehicle uses, as its drive power source, an electric motor driven by a DC power supply via an inverter in addition to a conventional engine. Thus, it obtains the drive power by driving the engine, and also obtains the drive power by such a manner that the inverter converts a DC voltage supplied from the DC power supply into an AC voltage, and the converted AV voltage drives the electric motor. The electric vehicle uses, as its drive power source, an electric motor driven by a DC power supply via an inverter.

An Intelligent Power Module (IPM) mounted on the hybrid vehicle or the electric vehicle is configured to perform fast switching in a semiconductor switching element (power semiconductor element) such as an IGBT (Insulated Gate Bipolar Transistor) and thereby converting the DC power supplied from the DC power supply into the AC power for driving the motor.

For example, Japanese Patent Laying-Open No. 2005-192296 has disclosed an inverter device having a plurality of inverter units each using a power device that is formed of a module capable of orthogonal three-phase power conversion. The plurality of inverter units have negative poles commonly connected to an integrally planar conductor (bus bar), and also have positive poles commonly connected to another integrally planar bus bar, respectively. The bus bar connected to the negative poles overlaps the bus bar connected to the positive poles with an insulator therebetween.

However, according to the above Japanese Patent Laying-Open No. 2005-192296, the plurality of inverter units share the bus bar, and this structure may suffer from a problem that a surge voltage generated in each inverter unit during a switching operation interferes with that of another inverter unit via the bus bar.

Thus, in the bus bar serving as a medium of electric power transmission and reception that are performed between the power supply and the plurality of inverter units, a surge voltage generated in each inverter unit is superimposed on the DC voltage to be originally transmitted or received. Therefore, when the DC voltage on which the surge voltage supplied from one of the inverter units is superimposed enters the other inverter unit via the bus bar, the level of the surge voltage may be amplified in the other inverter unit because the entered surge voltage may interference with the internally generated surge voltage. However, the above Japanese Patent Laying-Open No. 2005-192296 has not disclosed measures against such interference of the surge voltages.

For suppressing such amplification of the surge voltages, it is preferable to lower a switching speed corresponding to an open/close speed of the switching element in each inverter unit and thereby to reduce the surge voltage itself. However, the lowering of the switching speed increases the electric power loss that may occur in the switching operation.

Accordingly, the invention has been made for overcoming the above problems, and an object of the invention is to provide a power conversion device that can suppress the interference of surge voltages between the plurality of power conversion units.

DISCLOSURE OF THE INVENTION

According to the invention, a power conversion device includes first and second power conversion units each including a switching element for performing electric power conversion; first and second conductor members for electricity connecting the first and second power conversion units together; and a first capacitor for smoothing a voltage between the first and second lead members. An electric contact with the first capacitor is arranged in a section on the first lead member between an electric contact with the first power conversion unit and an electric contact with the second power conversion unit. An electric contact with the first capacitor is arranged in a section on the second lead member between an electric contact with the first power conversion unit and an electric contact with the second power conversion unit.

According to the above power conversion device, the first capacitor absorbs the surge voltages occurring in the first and second power conversion units through the electric contacts arranged on the first and second lead members, respectively. Therefore, interference of the surge voltages between the first and second power conversion units can be suppressed. Consequently, it is possible to reduce a loss power of the switching element.

Preferably, the first power conversion unit is a converter for boosting a DC voltage supplied from a power supply and applying the DC voltage between the first and second lead members. The second power conversion unit is an inverter including the switching element as an arm of each phase for performing power conversion between the DC power boosted by the converter and an AC power transmitted to/from an electric load.

According to the above power conversion device, since the first capacitor absorbs the surge voltage superimposed on the boosted voltage provided from the converter, the interference between this surge voltage and the surge voltage occurring in the inverter can be suppressed. Since the first capacitor absorbs the surge voltage superimposed on the DC voltage that is applied between the first and second lead members from the inverter, the interference between this surge voltage and the surge voltage occurring in the converter can be suppressed.

Preferably, the second power conversion unit includes, in each of the phases, the first and second switching elements connected in series between the first and second lead members, and includes a second capacitor for smoothing a voltage between the first and second lead members. An electric contact with the second capacitor is arranged in a section on the first lead member between an electric contact with the first switching element of a first phase and an electric contact with the first switching element of a second phase. An electric contact with the second capacitor is arranged in a section on the second lead member between an electric contact with the second switching element of the first phase and an electric contact with the second switching element of the second phase.

The power conversion device described above can further suppress the interference of the surge voltages between the switching elements forming the respective phases.

Preferably, the first power conversion unit is a first inverter including the switching element as an arm of each phase for performing power conversion between a DC power supplied from a power supply and an AC power driving a first electric load. The second power conversion unit is a second inverter including the switching element as an arm of each phase for performing power conversion between the DC power supplied from the power supply and an AC power driving a second electric load.

The above power conversion device can suppress the interference of the surge voltages between the plurality of inverters that receive from the common power supply via the first and second lead members.

Preferably, the first capacitor is independent of a substrate carrying the switching element. The first lead member is arranged on the substrate, is divided at a position within a section between an electric contact with the first power conversion unit and an electric contact with the second power conversion unit, and extends externally from the substrate to form an electric contact with the first capacitor. The second lead member is arranged on the substrate, is divided at a position within a section between an electric contact with the first power conversion unit and an electric contact with the second power conversion unit, and extends externally from the substrate to form an electric contact with the first capacitor.

The above power conversion device can easily suppress the interference of the surge voltages in the structure that includes the plurality of power conversion units formed of the switching elements arranged on the substrate and also includes the first capacitor arranged independently of the substrate.

According to the invention, the interference of the surge voltages between the plurality of power conversion units can be suppressed.

BEST MODES FOR CARRYING OUT THE INVENTION

Embodiments of the invention will now be described with reference to the drawings. In the following description, the same or corresponding portions bear the same reference numbers.

Figure 1:
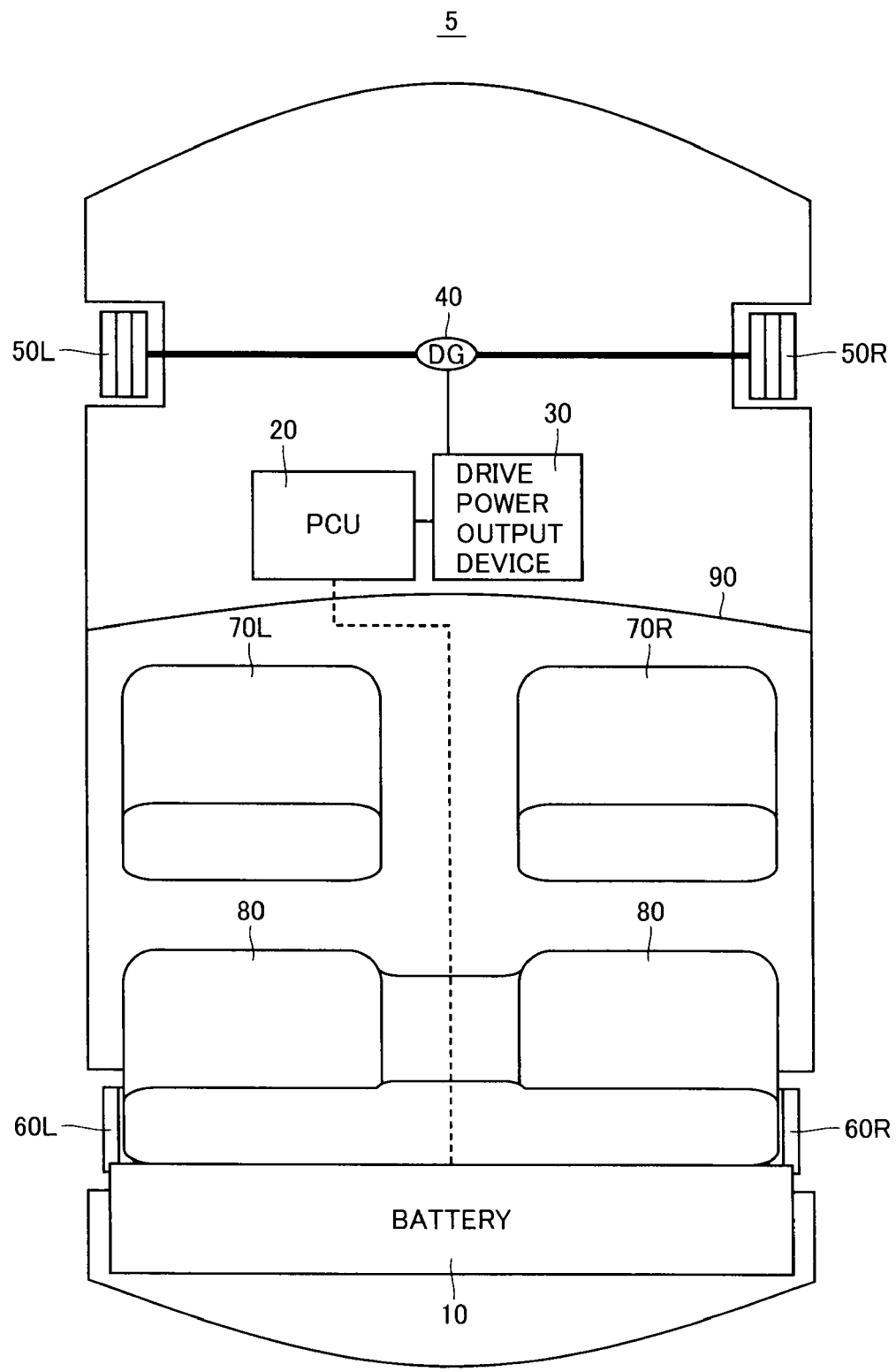
FIG. 1 is a schematic block diagram showing a whole structure of a hybrid vehicle shown as an example of mounting of a power module according to the invention.

FIG. 1 is a schematic block diagram showing a whole structure of a hybrid vehicle shown as an example of mounting of a power conversion device according to the invention.

Referring to FIG. 1, a hybrid vehicle 5 includes a battery 10, a PCU (Power Control Unit) 20, a drive power output device 30, a Differential Gear (DG) 40, front wheels 50L and 50R, rear wheels 60L and 60R, front seats 70L and 70R, and a rear seat 80.

Battery 10 is arranged behind rear seat 80. Battery 10 is electrically connected to PCU 20. PCU 20 is arranged, e.g., in a region under front seats 70L and 70R, and thus is arranged using a region under a floor. Drive power output device 30 is arranged in an engine room before a dashboard 90. PCU 20 is electrically connected to drive power output device 30, which is coupled to DG 40.

Battery 10 that is a DC power source is formed of a secondary battery such as a lithium ion battery or a nickel hydrogen battery, can supply a DC voltage to PCU 20 and can be charged with the DC voltage supplied from PCU 20.

PCU 20 boosts the DC voltage from battery 10, and converts the boosted DC voltage into an AC voltage for controlling driving of electric motors included in drive power output device 30. PCU 20 converts the AC voltage that is generated by generators included in drive power output device 30 into a DC voltage, and charges battery 10 with it. Thus, PCU 20 corresponds to a "power conversion device" performing electric power conversion between the DC power supplied from battery 10 and the AC power that is used for controlling the driving of the motor or is generated by the generator.

Drive power output device 30 transmits the drive power(s) of the engine and/or the motor to front wheels 50L and 50R via DG 40 for driving front wheels 50L and 50R. Drive power output device 30 generates the electric power from a rotation force of front wheels 50L and 50R, and supplies the electric power thus generated to PCU 20. Alternatively, drive power output device 30 may employ a motor generator having both functions as the electric motor and the generator.

DG 40 transmits the drive power supplied from drive power output device 30 to front wheels 50L and 50R, and also transmits the rotation force of front wheels 50L and 50R to drive power output device 30.

Figure 2:
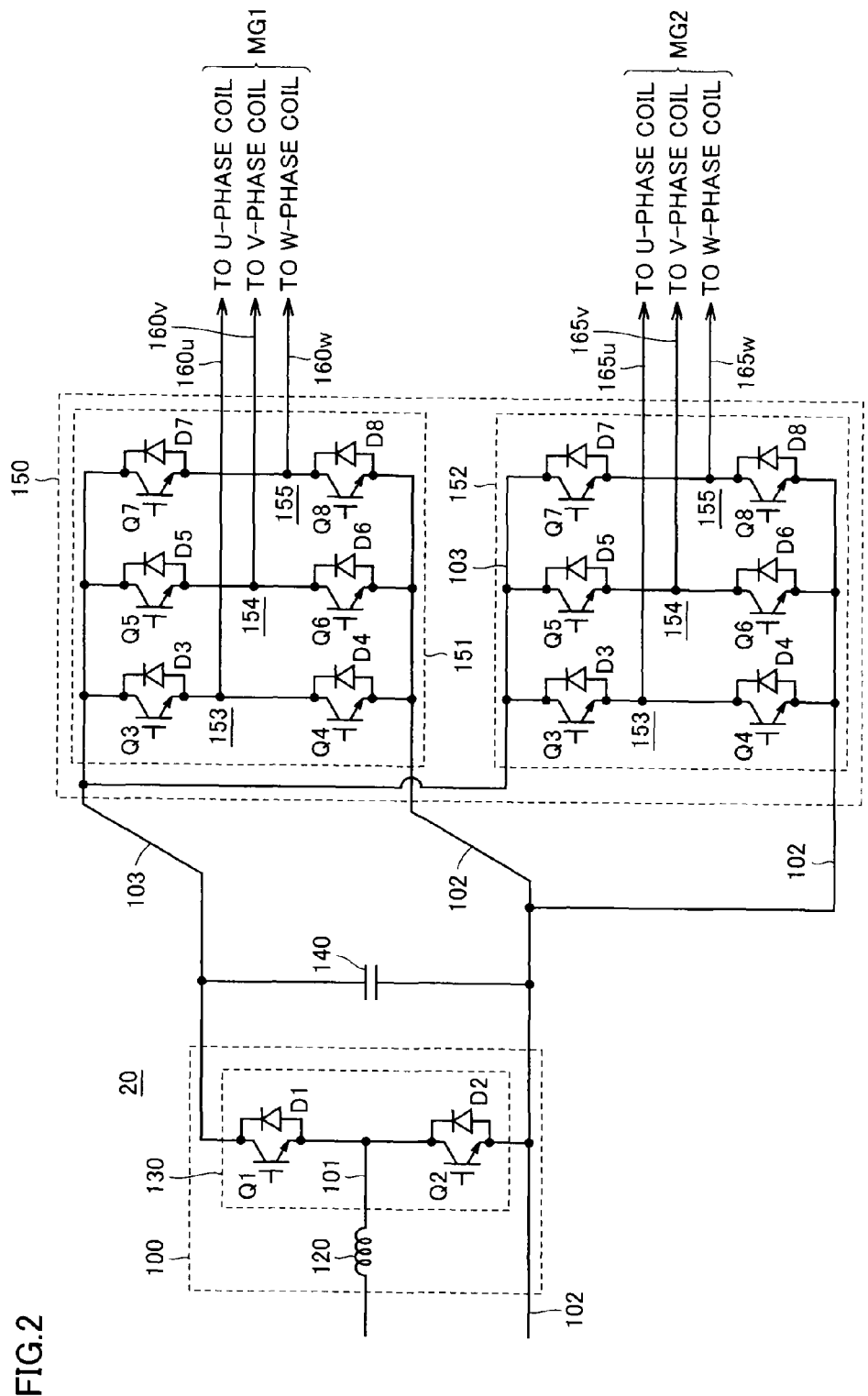
FIG. 2 is an electric circuit diagram showing a major portion of a PCU shown in FIG. 1.

FIG. 2 is an electric circuit diagram showing a major portion of PCU 20 shown in FIG. 1.

Referring to FIG. 2, PCU 20 includes a booster converter 100, a capacitor 140 and an inverter module 150.

Booster converter 100 forming a non-isolated booster chopper includes a reactor 120 and a boost power module 130. Boost power module 130 includes power switches Q1 and Q2 as well as diodes D1 and D2. In this embodiment, the power switch may be an IGBT (Insulated Gate Bipolar Transistor), an MOSFET (Metal Oxide Semiconductor-Field Effect Transistor) or the like.

Power switches Q1 and Q2 are connected in series between a power supply line 103 and an earth line 102. Power switch Q1 has a collector connected to power supply line 103 and an emitter connected to a collector of power switch Q2. An emitter of power switch Q2 is connected to earth line 102. Diodes D1 and D2 are arranged as anti-parallel diodes of power switches Q1 and Q2, respectively.

Reactor 120 has one end connected to a power supply line 101 as well as the other end connected to a connection node of each of power switches Q1 and Q2. Capacitor 140 is connected between power supply line 103 and earth line 102.

Inverter module 150 is formed of two inverters 151 and 152. Inverter 151 is formed of U-, V- and W-phase arms 153, 154 and 155. U-, V- and W-phase arms 153, 154 and 155 are connected in parallel between power supply line 103 and earth line 102.

U-phase arm 153 is formed of power switches Q3 and Q4 connected in series. V-phase arm 154 is formed of power switches Q5 and Q6 connected in series, and W-phase arm 155 is formed of power switches Q7 and Q8 connected in series. Power switches Q3-Q8 are connected to anti-parallel diodes D3-D8, respectively.

Output conductors 160u, 160v and 160w corresponding to midpoints of U-, V- and W-phase arms are connected to phase ends of respective phase coils of a motor generator MG1. Thus, motor generator MG1 is a three-phase permanent magnet motor, and has the three, i.e., U-, V- and W-phase coils each having one end commonly connected to a midpoint. Also, the other ends of the U- V- and W-phase coils are connected to output conductors 160u, 160v and 160w, respectively.

Inverter 152 has the same structure as inverter 151. Output conductor 165u, 165v and 165w corresponding to the midpoints of the U-, V- and W-phase arms of inverter 152 are connected to phase ends of respective phase coils of a motor generator MG2. Thus, motor generator MG2 is likewise a three-phase permanent magnet motor, and has the three, i.e., U-, V- and W-phase coils each having one end commonly connected to the midpoint. The other ends of U-, V- and W-phase coils are connected to output conductor 165u, 165v and 165w, respectively.

Booster converter 100 receives a DC voltage applied between power supply line 101 and earth line 102 by battery 10. By the switching control of power switches Q1 and Q2, booster converter 100 boosts the DC voltage and supplies it to capacitor 140.

Capacitor 140 smoothes the DC voltage supplied from booster converter 100, and supplies it to inverters 151 and 152. Inverter 151 converts the DC voltage supplied from capacitor 140 into an AC voltage and thereby drives motor generator MG1. Inverter 152 converts the DC voltage supplied from capacitor 140 into the AC voltage and thereby drives motor generator MG2.

Inverter 151 converts the AC voltage generated by motor generator MG1 into the DC voltage, and supplies it to capacitor 140. Inverter 152 converts the AC voltage generated by motor generator MG2 into the DC voltage, and supplies it to capacitor 140.

Capacitor 140 smoothes the DC voltage supplied from motor generator MG1 or MG2, and supplies it to booster converter 100. Booster converter 100 steps down the DC voltage supplied from capacitor 140, and supplies it to battery 10 or a DC/AC converter (not shown).

In the above structure, boost power module 130 and inverter module 150 formed of the power switches are integrated together to form a semiconductor module according to the invention. Reactor 120 included in booster converter 100 and capacitor 140 for smoothing have relatively large sizes so that these are independently arranged outside the semiconductor module.

[Structure of the Semiconductor Module According to the Invention]

Before describing the whole structure of the semiconductor module according to the invention, description will be given, for comparison, on an example of a structure of a conventional semiconductor module that has been generally employed.

Figure 3:
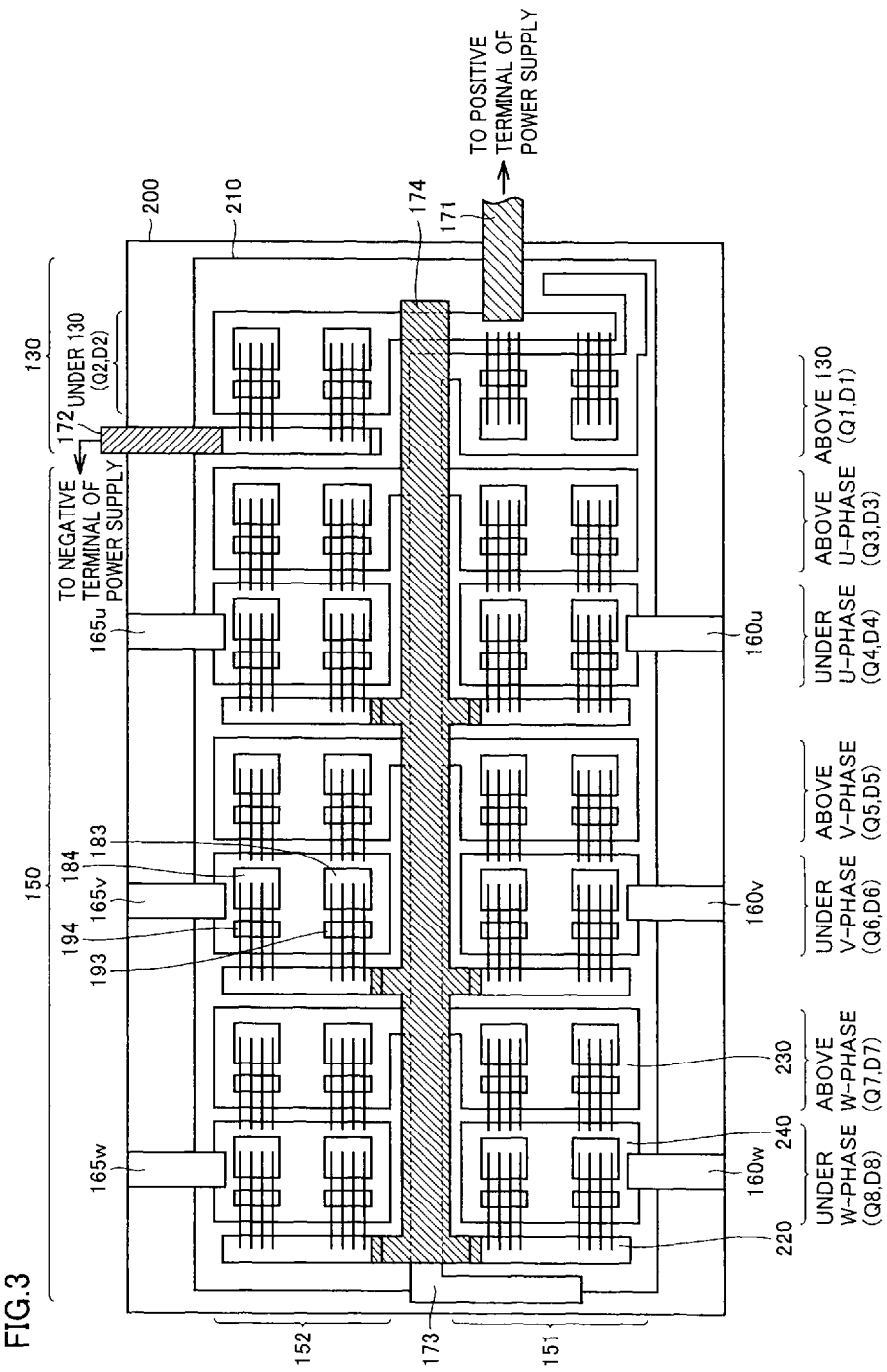
FIG. 3 illustrates a general layout of a semiconductor module in FIG. 2.

FIG. 3 illustrates a general layout of a semiconductor module in FIG. 2. In the following description, vertical and horizontal directions in FIG. 3 will be regarded as longitudinal and lateral directions for the sake of description, respectively.

Referring to FIG. 3, a semiconductor module includes bus bars 171-174 extending on an insulating substrate 210, and also includes switches Q1-Q8 and diodes D1-D8 arranged above or below bus bars 173 and 174.

Insulating substrate 210 is made of, e.g., polyimide. When insulating substrate 210 is made of polyimide, it can have an improved resistance against a stress that occurs in the substrate due to thermal expansion and the like, as compared with a substrate made of aluminum nitride, and therefore, this structure is effective at increasing an area.

Further, a heat radiation plate 200 is attached to a lower surface of insulating substrate 210. Heat radiation plate 200 can cool the semiconductor module.

Bus bar 173 forms power supply line 103 connecting booster converter 100 in FIG. 2 to inverters 151 and 152. Bus bar 174 forms earth line 102 connecting booster converter 100 in FIG. 2 to inverters 151 and 152. Bus bars 173 and 174 are stacked together in a normal direction (perpendicular to a sheet of FIG. 3) with an insulating member (not shown) therebetween.

Further, bus bar 173 is connected to bus bar 171 via power switch Q1, and bus bar 172 is connected to bus bar 172 via power switch Q2. Bus bars 171 and 172 form power supply line 101 and earth line 102 in FIG. 2, and are connected to positive and negative terminals (not shown) of battery 10, respectively. Thus, bus bar 171 forms power supply line 101 in FIG. 2, bus bar 173 forms power supply line 103 in FIG. 2, and a combination of bus bars 172 and 174 forms earth line 102 in FIG. 2.

Power switches Q3-Q8 and diodes D3-D8 arranged above bus bars 173 and 174 form inverter 152 in FIG. 2. Power switches Q3-Q8 and diodes D3-D8 arranged under bus bars 173 and 174 form inverter 151 in FIG. 2. Power switches Q1 and Q2 as well as diodes D1 and D2 that are arranged on the under and lower sides of bus bars 173 and 174, respectively, form boost power module 130 in FIG. 2.

In the example shown in FIG. 3, U-phase arms 153 of inverters 151 and 152 (power switches Q3 and Q4, and diodes D3 and D4), V-phase arms 154 of inverters 151 and 152 (power switches Q5 and Q6, and diodes D5 and D6), and W-phase arms 155 (power switches Q7 and Q8, and diodes D7 and D8) are arranged in this order from the right side of FIG. 3 to the left side thereof.

Each of power switches Q3-Q8 is formed of a parallel connection of two switching elements, and each of diodes D3-D8 is formed of a parallel connection of two diode elements. For example, power switch Q5 of the V-phase-upper arm is formed of a parallel connection of switching elements 183 and 184, and diode D5 is formed of a parallel connection of diode elements 193 and 194. This structure can prevent application of an excessive load to the switching element that may occur due to increase of a passing current.

On insulating substrate 210 carrying these switching elements and diode elements, metal electrodes 220, 230 and 240 are formed. Metal electrode 220 is an N-electrode, of which one end is coupled to bus bar 174 forming earth line 102. Metal electrode 230 is a P-electrode, of which one end is coupled to bus bar 173 forming power supply line 103. Metal electrode 240 is an output electrode that is electrically connected to each of output conductors 160u-160w and 165u-165w shown in FIG. 2. These three electrodes, i.e., N-electrode 220, P-electrode 230 and output electrode 240 are arranged corresponding to each of U-, V- and W-phases in each of inverters 151 and 152.

Each of the switching elements and diode elements is electrically connected by wire bonding or the like to N-electrode 220, P-electrode 230 and output electrode 240 to implement the electric connection shown in FIG. 2. Insulating substrate 210 is soldered to heat radiation plate 200 via a lower aluminum electrode (not shown).

In a conventional semiconductor module, as shown in FIG. 3, boost power module 130 and inverter module 150 are integrated together on common insulating substrate 210 to achieve reduction in footprint of the whole semiconductor module. This module structure can have a cooling system shared among inverters 151 and 152 as well as boost power module 130, and therefore has an advantage that the whole semiconductor module has small sizes.

However, power supply line 103 and earth line 102 that form a medium for power transmission between battery 10 and motor generators MG1 and MG2 share bus bars 173 and 174, and this structure may cause such a problem that interference occurs between surge voltages occurring in the respective power switches included in boost power module 130 and inverter module 150, and therefore amplifies the voltage levels thereof.

Such interference of the surge voltages may occur, e.g., due to the fact that the surge voltage occurring in the power switch of boost power module 130 enters inverter module 150 via bus bars 173 and 174 before it is absorbed by capacitor 140 arranged outside the semiconductor module.

More specifically, in the structure shown in FIG. 2, booster converter 100 receives the DC voltage applied between power supply line 101 and earth line 102 by battery 10 (not shown), boosts it by the switching operation of power switches Q1 and Q2, and supplies it to capacitor 140. A boost ratio of booster converter 100 depends on an on-period ratio (duty ratio) between power switches Q1 and Q2.

Figure 4:
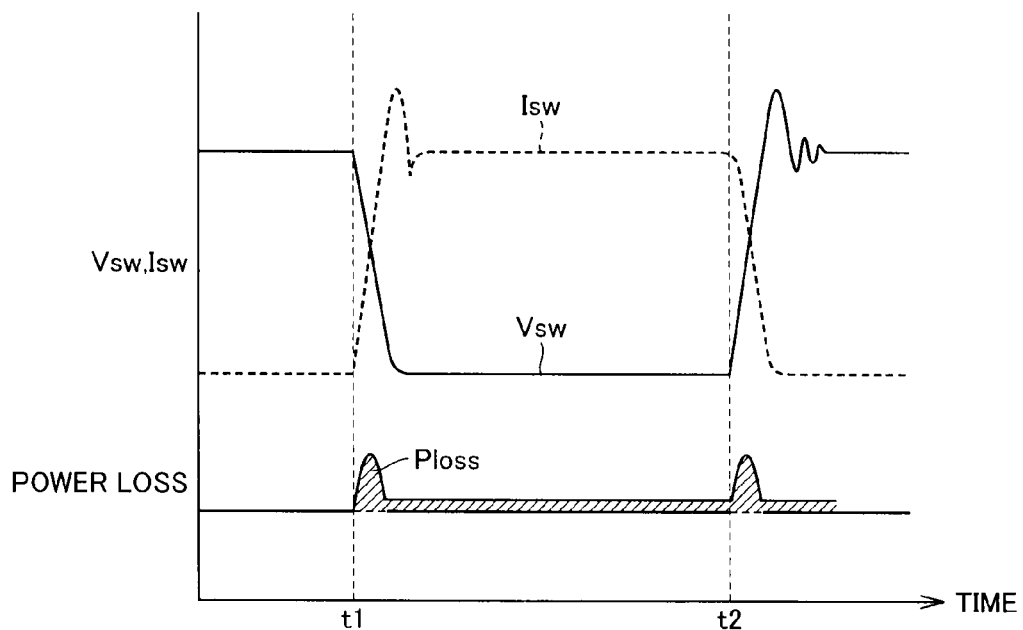
FIG. 4 illustrates a switching operation of a boost power module.

When the above operation is performed, the surge voltage occurs in boost power module 130 during the switching operation. FIG. 4 illustrates the switching operation of boost power module 130. Although FIG. 4 representatively illustrates the operation of power switch Q1, a similar operation take places in power switch Q2.

Referring to FIG. 4, before a time t1, a switching voltage Vsw between the collector and emitter of power switch Q1 is not zero (Isw≠0), and a switching current Isw thereof is zero (Isw=0).

When a turn-on operation of power switch Q1 starts at time t1, switching current Isw starts to flow, and switching voltage Vsw lowers.

When a turn-off operation of power switch Q1 starts at time t2, switching current Isw starts to lower, and switching voltage Vsw rises. In a completely turned off state, switching current Isw becomes equal to zero (Isw=0).

In a practical switching operation, switching current Isw and switching voltage Vsw change according to a constant rate corresponding to a changing speed of the gate potential of power switch Q1. The constant rate corresponding to the changing speed of the gate potential corresponds to an open/close speed of power switch Q1, and is also referred to as a "switching speed".

In the above operation, the surge voltage (V=L·dIsw/dt) proportional to the changing speed (dIsw/dt) of switching current Isw occurs, where L indicates an inductance of internal interconnections of boost power module 130 and bus bars.

Further, a loss power Ploss that corresponds to a product of switching current Isw and switching voltage Vsw occurs in power switch Q1 at the time of switching. For suppressing loss power Ploss, it is preferable to increase the switching speed. However, the increase in switching speed increases the changing speed of switching current Isw, and consequently increases the surge voltage.

The surge voltage that occurs at the time of switching is superimposed on the boosted DC voltage, and is applied between power supply line 103 and earth line 102. Capacitor 140 is arranged for absorbing the surge voltage from the boosted DC voltage.

However, on the layout of the practical semiconductor module, as shown in FIG. 3, power supply line 103 and earth line 102 share bus bars 173 and 174. Therefore, there is high possibility that the surge voltage applied between bus bars 173 and 174 from boost power module 130 is not absorbed by capacitor 140 arranged outside the semiconductor module, and is directly provided to inverter module 150.

Thereby, in inverters 151 and 152, the interference occurs between the surge voltage that occurs in each of power switches Q3-Q8 and the surge voltage provided from boost power module 130 as a result of the switching operation for converting the input DC voltage into the AC voltage. Particularly, when the timing of the switching operation in boost power module 130 overlaps the timing of the switching operations of inverters 151 and 153, the surge voltage is amplified.

The above interference of surge voltages between boost power module 130 and inverter module 150 may also occur when the AC voltage generated by motor generator MG1 or MG2 is supplied to capacitor 140 after being converted into the DC voltage.

For suppressing the interference of the surge voltage, it is generally preferable to lower the switching speed in the power switch for suppressing the generation of the surge voltage itself, as shown in FIG. 4. However, the lowering of the switching speed increases loss power Ploss, resulting in increase of the heat release value of the power switch. Accordingly, in the conventional semiconductor module, the power switch must be formed of large switching elements having a large margin of current capacity, or a cooling performance of the semiconductor power module must be increased, resulting in disadvantageous increase in size and cost of the semiconductor power module.

Accordingly, in the structure of the semiconductor module according to the invention, an electric contact for establishing an electric connection of capacitor 140 employed for absorbing the surge voltage to bus bars 173 and 174 is arranged between the electric contact formed between boost power module 130 and bus bars 173 and 174, and the electric contact formed between inverter module 150 and bus bars 173 and 174.

Figure 5:
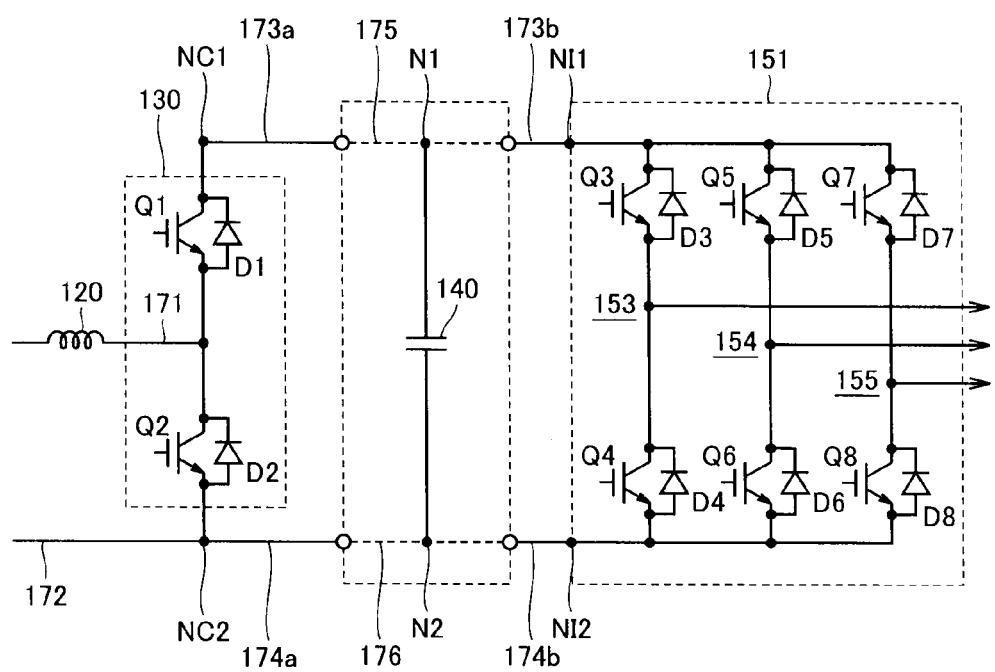
FIG. 5 schematically shows a structure of the semiconductor module according to the invention.

FIG. 5 schematically shows a structure of the semiconductor module according to the invention. For the sake of simplicity, FIG. 5 shows only boost power module 130, capacitor 140 and inverter 151 in PCU 20, and the illustration and description of inverter 152 having substantially the same structure as inverter 151 will not be repeated.

Referring to FIG. 5, the bus bar forming power supply line 103 (FIG. 2) is divided into bus bars 173a and 173b. A lead member 175 extended externally from the semiconductor module is coupled between divided bus bars 173a and 173b. Lead member 175 has an electric contact N1 for one of the terminals of capacitor 140 arranged outside the semiconductor module. Thus, electric contact N1 is arranged between an electric contact NC1 between boost power module 130 and bus bar 173a, and an electric contact NI1 between inverter 151 and bus bar 173b.

The bus bar forming earth line 102 (FIG. 2) is divided into bus bars 174a and 174b. A lead member 176 extending externally from the semiconductor module is coupled between divided bus bars 174a and 174b. Lead member 176 has an electric contact N2 for the other terminal of capacitor 140. Thus, electric contact N2 is arranged between an electric contact NC2 formed between boost power module 130 and bus bar 174a, and an electric contact NI2 between inverter 151 and bus bar 174b.

In the above structure, when the surge voltage generated in boost power module 130 is applied between bus bars 173a and 174a through electric contacts NC1 and NC2, it is absorbed by capacitor 140 connected between electric contacts N1 and N2. Therefore, the boosted DC voltage from which the surge voltage is removed is provided to inverter 151 via electric contacts NI1 and NI2. Consequently, power switches Q3-Q8 of inverter 151 suppress the interference of the surge voltage described before.

Description will now be given on an example of a specific structure that implements the electric connection shown in FIG. 5 on the layout of the semiconductor module.

Figure 6:
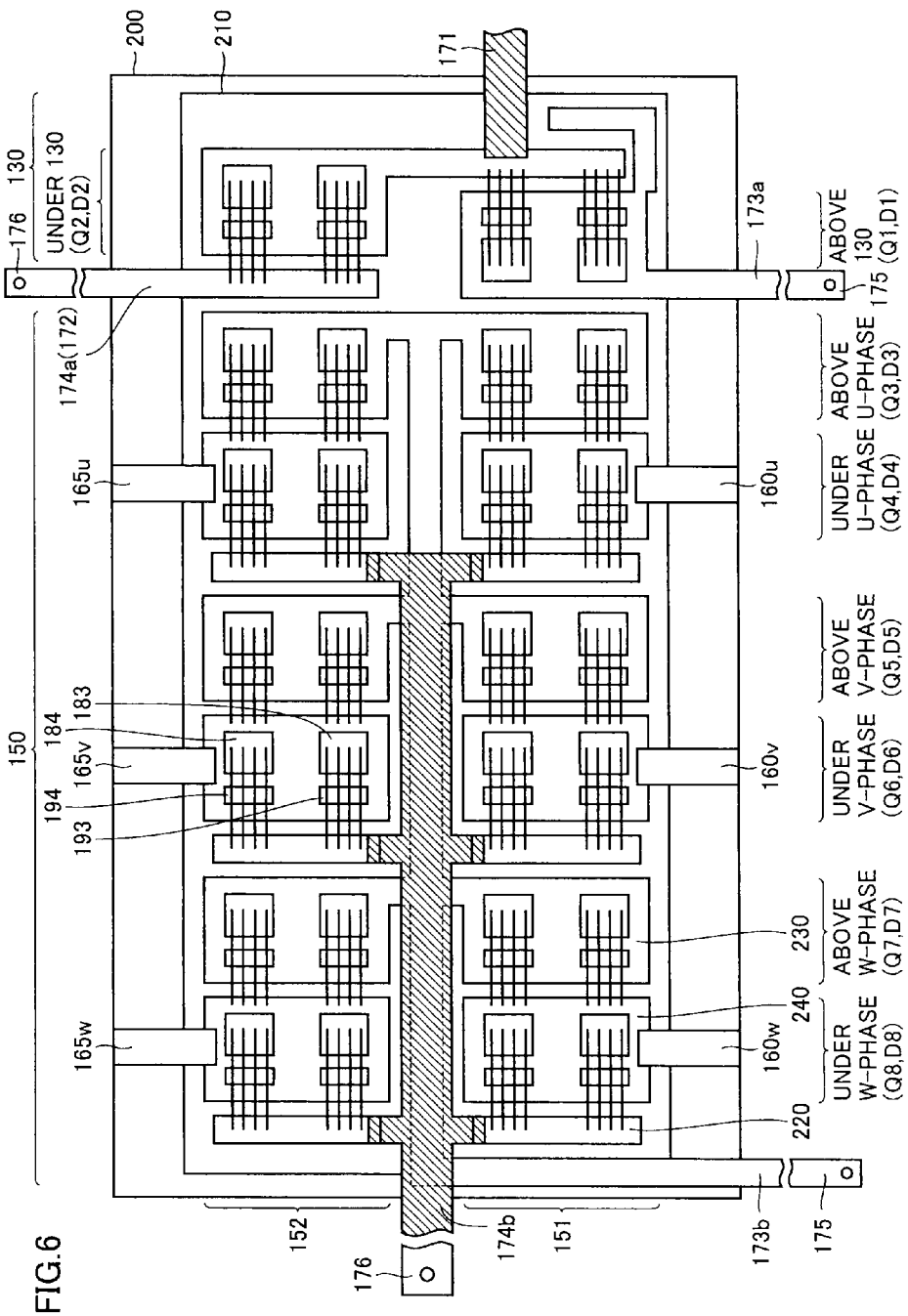
FIG. 6 shows a layout of the semiconductor module according to the invention.

FIG. 6 shows a layout of the semiconductor module according to the invention. The layout shown in FIG. 6 differs from that of the conventional semiconductor module shown in FIG. 3 in that bus bar 173 forming power supply line 103 is divided into bus bars 173a and 173b, and bus bar 174 forming earth line 102 is divided into bus bars 174a and 174b.

More specifically, bus bar 173a has one end connected to bus bar 171 via power switch Q1, and also has the other end coupled to lead member 175 to form electric contact N1 (FIG. 5) for one of the terminals of capacitor 140 arranged outside the semiconductor module.

Likewise, bus bar 174a has one end connected to bus bar 172 as well as the other end coupled to lead member 176 for forming electric contact N2 (FIG. 5) with the other terminal of capacitor 140.

Bus bar 173b is coupled to a P-electrode 230 of each phase of inverters 151 and 152, and has one end coupled to lead member 175 for forming electric contact N1 (FIG. 5) with one of the terminals of capacitor 140.

Further, bus bar 174b is coupled to an N-electrode 220 of each phase of inverters 151 and 152, and has one end coupled to lead member 176 for forming electric contact N2 (FIG. 5) with the other terminal of capacitor 140.

According to the semiconductor module of the invention, as described above, each of bus bars 173 and 174 that have integrally planar structures in the conventional semiconductor module, respectively, is divided so that electric contacts N1 and N2 between capacitor 140 and respective bus bars 173 and 174 are reliably formed between boost power module 130 and inverter module 150. This structure can suppress the interference of the surge voltages occurring during the switching operation between boost power module 130 and inverter module 150. Therefore, the switching speed can be increased in the switching operation so that loss power Ploss can be reduced. Consequently, the heat release value of the power switch can be suppressed, and the reduction in size and cost of the semiconductor power module can be implemented.

The interference of the surge voltages occurs between boost power module 130 and inverter module 150 through the bus bars as described above, and further may occur between inverters 151 and 152 inside inverter module 150. Further, such interference may occur between U-, V- and W-phase arms 153, 154 and 155 that form each of inverters 151 and 152.

Accordingly, description will be given on a first modification that is a structure for suppressing the interference between inverters 151 and 152. As a second modification, description will be given on a structure for suppressing the interference of the surge voltages between U-, V- and W-phase arms 153, 154 and 155.

[First Modification]

Figure 7:
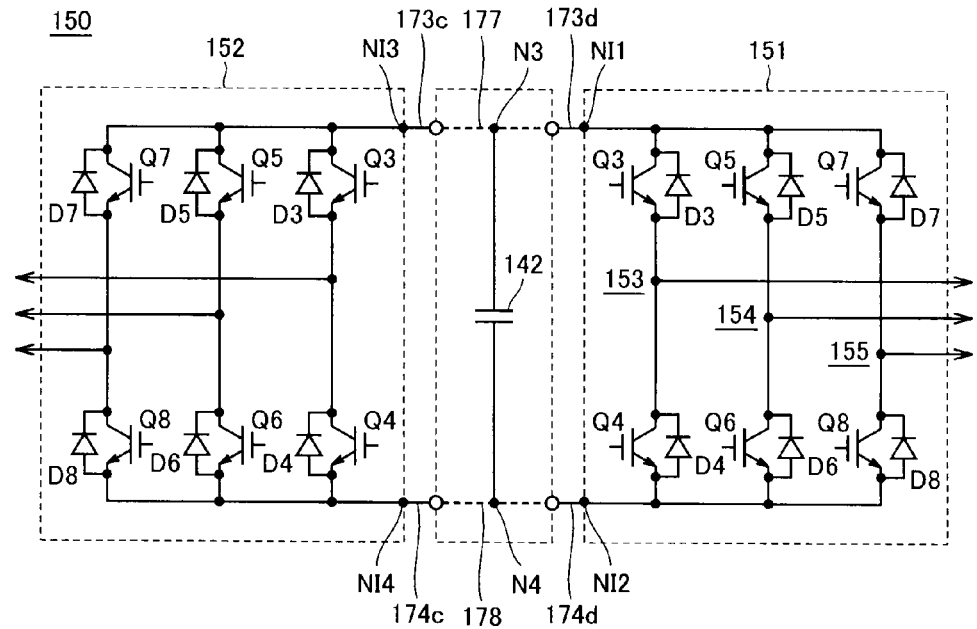
FIG. 7 is a schematic view illustrating a first modification of a structure of the semiconductor module according to the invention.

FIG. 7 is a schematic view illustrating a first modification of a structure of the semiconductor module according to the invention. For the sake of simplicity, FIG. 7 shows only inverter module 150 in inverter module 150 of PCU 20 shown in FIG. 2.

Referring to FIG. 7, capacitor 142 for absorbing the surge voltage is arranged between inverters 151 and 152.

The bus bar forming power supply line 103 (FIG. 2) is divided into bus bars 173c and 173d. A lead member 177 extending externally from the semiconductor module is coupled between divided bus bars 173c and 173d. Lead member 177 is provided with an electric contact N3 for one of the terminals of capacitor 142 outside the semiconductor module. Thus, electric contact N3 is arranged between electric contact NI1 formed between inverter 151 and bus bar 173d, and an electric contact NI3 formed between inverter 152 and bus bar 173c.

The bus bar forming earth line 102 (FIG. 2) is divided into bus bars 174c and 174d. A lead member 178 extending externally from the semiconductor module is coupled between divided bus bars 174c and 174d. Lead member 178 is provided with an electric contact N4 for the other terminal of capacitor 142. Thus, electric contact N4 is arranged between electric contact NI2 formed between inverter 151 and bus bar 174d, and an electric contact NI4 formed between inverter 152 and bus bar 174c.

In inverter 151 having the above structure, when the surge voltage occurring in the switching operation is applied between bus bars 173d and 174d through electric contacts NI1 and NI2, capacitor 142 connected between electric contacts N3 and N4 absorbs this surge voltage. Likewise, in inverter 152, when the surge voltage occurring in the switching operation is applied between bus bars 173c and 174c through electric contacts NI3 and NI4, capacitor 142 connected between electric contacts N3 and N4 absorbs this surge voltage. Consequently, the interference of the surge voltages between inverters 151 and 152 can be suppressed.

For implementing the structure in FIG. 7 on the practical layout, each of bus bars 173 and 174 arranged between inverters 151 and 152 is divided, similarly to the aforementioned embodiment, and thereby electric contacts N3 and N4 for capacitor 142 and bus bars 173 and 174 can be reliably arranged between inverters 151 and 152.

[Second Modification]

Figure 8:
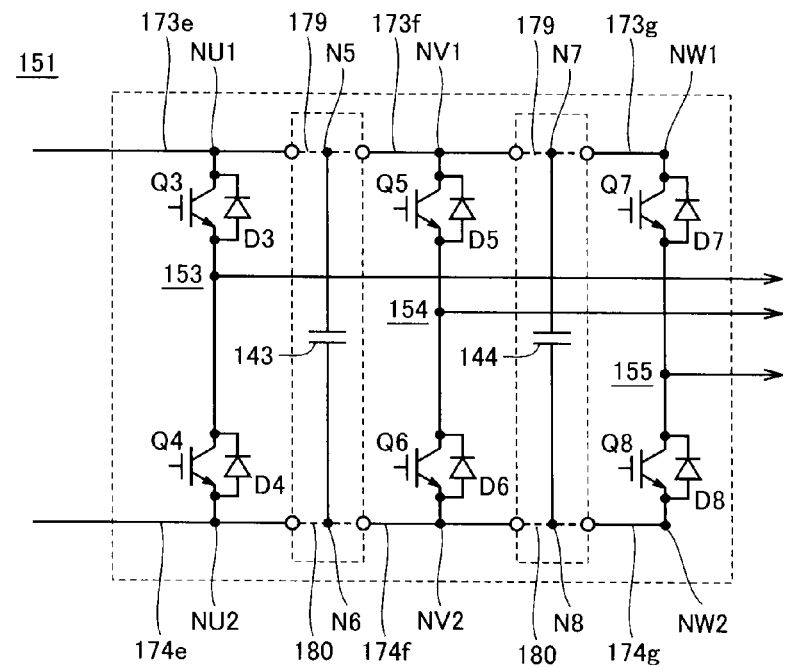
FIG. 8 is a schematic view illustrating a second modification of the semiconductor module according to the invention.

FIG. 8 is a schematic view illustrating a second modification of the semiconductor module according to the invention. For the sake of simplicity, FIG. 8 shows only inverter 151 in inverter module 150 of PCU 20 shown in FIG. 2, and the illustration and description of inverter 152 having substantially the same structure as inverter 151 will not be repeated.

In inverter 151 shown in FIG. 8, a capacitor 143 for absorbing the surge voltage is arranged between U- and V-phase arms 153 and 154. A capacitor 144 for absorbing the surge voltage is arranged between V- and W-phase arms 154 and 155.

The bus bar forming power supply line 103 (FIG. 2) is divided into bus bars 173e, 173f and 173g. A lead member 179 extending externally from the semiconductor module is coupled between divided bus bars 173e and 173f. Lead member 179 is provided with an electric contact N5 for one of the terminals of capacitor 143 outside the semiconductor module. Thus, electric contact N5 is arranged between an electric contact NU1 formed between U-phase arm 153 and bus bar 173e, and an electric contact NV1 formed between V-phase arm 154 and bus bar 173f.

Further, lead member 179 extending externally from the semiconductor module is coupled between bus bars 173f and 173g. Lead member 179 is provided with an electric contact N7 for one of the terminals of capacitor 144 outside the semiconductor module. Thus, electric contact N7 is arranged between electric contact NV1 formed between V-phase arm 154 and bus bar 173f, and an electric contact NW1 formed between W-phase arm 155 and bus bar 173g.

The bus bar forming earth line 102 (FIG. 2) is divided into bus bars 174e, 174f and 174g. A lead member 180 extending outward from the semiconductor module is coupled between divided bus bars 174e and 174f. Lead member 180 is provided with an electric contact N6 for the other terminal of capacitor 143. Thus, electric contact N6 is arranged between an electric contact NU2 formed between U-phase arm 153 and bus bar 174e, and an electric contact NV2 formed between V-phase arm 154 and bus bar 174f.

Lead member 180 extending outward from the semiconductor module is coupled between divided bus bars 174f and 174g. Lead member 180 is provided with an electric contact N8 for the other terminal of capacitor 144. Thus, electric contact N8 is arranged between electric contact NV2 formed between V-phase arm 154 and bus bar 174f, and an electric contact NW2 formed between W-phase arm 155 and bus bar 174g.

According to the above structure, when the surge voltage occurring in U-phase arm 153 during the switching operation is applied between bus bars 173e and 174e through electric contacts NU1 and NU2, capacitor 143 connected between electric contacts N5 and N6 absorbs this surge voltage. Likewise, when the surge voltage occurring in V-phase arm 154 during the switching operation is applied between bus bars 173f and 174f through electric contacts NV1 and NV2, capacitor 143 connected between electric contacts N5 and N6 absorbs this surge voltage. Consequently, the interference of the surge voltages between U- and V-phase arms 153 and 154 is suppressed.

Further, capacitor 144 can achieve similar effect between V- and W-phase arms 154 and 155.

For achieving the structure in FIG. 8 on the practical layout, bus bars 173 and 174 connected to P- and N-electrodes 230 and 220 of each phase arm, respectively, are divided similarly to the embodiment already described, and thereby electric contacts N5 and N6 for capacitor 143 and bus bars 173 and 174 can be ensured between U- and V-phase arms 153 and 154. Further, electric contacts N7 and N8 for capacitor 144 and bus bars 173 and 174 can be ensured between V- and W-phase arms 154 and 155.

The embodiment and modifications described above can be appropriately combined with each other. Thus, a structure provided with at least one of capacitors 140, 142, 143 and 144 shown in FIGS. 5, 7 and 8 may be employed.

The capacitor employed in the embodiment of the invention may be an aluminum electric field capacitor, a film capacitor or the like. Particularly, a film capacitor having a relatively small inductance can effectively reduce a surge voltage.

The embodiment of the invention has been described in connection with the structure example using the semiconductor module according to the invention in the Power Control Unit (PCU) of the hybrid vehicle, which is a typical example of a use strongly requiring reduction in size of the semiconductor module in view of spatial restrictions in a mounted state. However, the use of the invention is not restricted to the above structure, and the invention can likewise be applied to a semiconductor module of a structure that employs a plurality of power conversion devices each having power switches.

Although the present invention has been described and illustrated in detail, it is clearly understood that the same is by way of illustration and example only and is not to be taken by way of limitation, the scope of the present invention being interpreted by the terms of the appended claims.

INDUSTRIAL APPLICABILITY

The invention can be applied to a power conversion device provided with a plurality of power conversion units.

The invention claimed is:

1. A power conversion device, comprising:
   first and second power conversion units each including a switching element for performing electric power conversion;
   first and second lead members for electricity connecting said first and second power conversion units together; and
   a first capacitor for smoothing a voltage between said first and second lead members, wherein
   said first lead member is divided into a first lead portion having one end connected to said first power conversion unit and the other end coupled to a lead member for forming an electric contact with one of terminals of said first capacitor, and a second lead portion having one end connected to said second power conversion unit and the other end coupled to the lead member for forming the electric contact with the one terminal of said first capacitor,
   said second lead member is divided into a third lead portion having one end connected to said first power conversion unit and the other end coupled to a lead member for forming an electric contact with the other terminal of said first capacitor, and a fourth lead portion having one end connected to said second power conversion unit and the other end coupled to the lead member for forming the electric contact with the other terminal of said first capacitor,
   said first lead member is a bus bar forming a power supply line, said first lead portion is a first bus bar, and said second lead portion is a second bus bar, said second lead member is a bus bar forming an earth line, said third lead portion is a third bus bar, said fourth lead portion is a fourth bus bar, each of said first and second lead members having integrally planar structures in a semiconductor module,
   one end of said first bus bar is connected to said first power conversion unit via a first switching member of said first power conversion unit and the other end of said first bus bar is coupled to the lead member for forming an electric contact with one of terminals of said first capacitor, and
   one end of said third bus bar is connected to said first power conversion unit via a second switching member of said first power conversion unit and the other end of said third bus bar is connected to the lead member for forming an electric contact with the other terminal of said first capacitor.

2. The electric power conversion device according to claim 1, wherein
   said first power conversion unit is a converter for boosting a DC voltage supplied from a power supply and applying the DC voltage between said first and second lead members, and
   said second power conversion unit is an inverter including said switching element as an arm of each phase for performing power conversion between the DC power boosted by said converter and an AC power transmitted to/from an electric load.

3. The electric power conversion device according to claim 2, wherein
   said second power conversion unit includes, in each of said phases, first and second switching elements connected in series between said first and second lead members, and includes a second capacitor for smoothing a voltage between said first and second lead members, and
   said first lead member is divided into a fifth lead portion having one end connected to said first switching element of said first phase and the other end coupled to a lead member for forming an electric contact with one of terminals of said second capacitor, and a sixth lead portion having one end connected to said first switching element of said second phase and the other end coupled to a lead member for forming an electric contact with the one terminal of said second capacitor, and said second lead member is divided into a seventh lead portion having one end connected to said second switching element of said first phase and the other end coupled to a lead member for forming an electric contact with the other terminal of said second capacitor, and an eighth lead portion having one end coupled to said lead member for forming an electric contact with said second switching element of said second phase.

4. The electric power conversion device according to claim 1, wherein said first power conversion unit is a first inverter including said switching element as an arm of each phase for performing power conversion between a DC power supplied from a power supply and an AC power driving a first electric load, and said second power conversion unit is a second inverter including said switching element as an arm of each phase for performing power conversion between the DC power supplied from said power supply and an AC power driving a second electric load.

5. The electric power conversion device according to claim 1, wherein said first capacitor is independent of a substrate carrying said switching element, said first lead member is arranged on said substrate, is divided at a position within a section between an electric contact with said first power conversion unit and an electric contact with said second power conversion unit, and extends externally from said substrate to form an electric contact with said first capacitor, and said second lead member is arranged on said substrate, is divided at a position within a section between an electric contact with said first power conversion unit and an electric contact with said second power conversion unit, and extends externally from said substrate to form an electric contact with said first capacitor.

6. The electric power conversion device according to claim 1, wherein said first and second power conversion units are arranged on the same substrate.

7. The electric power conversion device according to claim 1, wherein the first lead portion and the second lead portion are separate and distinct from each other.

8. The electric power conversion device according to claim 1, wherein the third lead portion and the fourth lead portion are separate and distinct from each other.

9. The electric power conversion device according to claim 5, wherein the first and second power conversion units are arranged on the same substrate.

* * * * *